United States Patent
Xiong et al.

(10) Patent No.: US 11,412,613 B2
(45) Date of Patent: Aug. 9, 2022

(54) FLEXIBLE PRINTED CIRCUIT AND MANUFACTURE METHOD THEREOF, ELECTRONIC DEVICE MODULE AND ELECTRONIC DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Ren Xiong, Beijing (CN); Qiang Tang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 252 days.

(21) Appl. No.: 16/766,787

(22) PCT Filed: Jan. 22, 2020

(86) PCT No.: PCT/CN2020/073850
§ 371 (c)(1),
(2) Date: May 26, 2020

(87) PCT Pub. No.: WO2020/156456
PCT Pub. Date: Aug. 6, 2020

(65) Prior Publication Data
US 2021/0212207 A1 Jul. 8, 2021

(30) Foreign Application Priority Data
Jan. 30, 2019 (CN) .......................... 201910093325.1

(51) Int. Cl.
*H05K 1/00* (2006.01)
*H05K 1/11* (2006.01)
(Continued)

(52) U.S. Cl.
CPC ............. *H05K 1/118* (2013.01); *H05K 1/147* (2013.01); *H05K 3/207* (2013.01)

(58) Field of Classification Search
CPC ......... H05K 1/118; H05K 1/147; H05K 3/207
(Continued)

(56) References Cited

U.S. PATENT DOCUMENTS

2002/0131258 A1  9/2002  Inoue et al.
2009/0244871 A1  10/2009 Lin
(Continued)

FOREIGN PATENT DOCUMENTS

| CN | 105632382 A | 6/2016 |
| CN | 105960091 A | 9/2016 |
| CN | 207410590 U | 5/2018 |

*Primary Examiner* — Andargie M Aychillhum
(74) *Attorney, Agent, or Firm* — Dilworth & Barrese, LLP.; Michael J. Musella, Esq.

(57) ABSTRACT

A flexible printed circuit and a manufacture method thereof, an electronic device module and an electronic device are provided. The flexible printed circuit includes a main sub-circuit board and a transfer sub-circuit board. The main sub-circuit board includes a first transfer terminal, a first wiring portion and a second wiring portion; and the transfer sub-circuit board includes a second transfer terminal and a third wiring portion, and the third wiring portion electrically connects a first group of second contact pads with a second group of second contact pads of the second transfer terminal. The transfer sub-circuit board is configured to be mounted on the main sub-circuit board by electrically connecting the first group of second contact pads to the first group of first (Continued)

contact pads and electrically connecting the second group of second contact pads to the second group of first contact pads.

18 Claims, 6 Drawing Sheets

(51) Int. Cl.
*H05K 1/14* (2006.01)
*H05K 3/20* (2006.01)

(58) Field of Classification Search
USPC .......................................................... 174/254
See application file for complete search history.

(56) References Cited

U.S. PATENT DOCUMENTS

| | | | |
|---|---|---|---|
| 2010/0051326 A1* | 3/2010 | Sagisaka .............. | H05K 3/4691 174/254 |
| 2012/0146022 A1* | 6/2012 | Hida ..................... | G02F 1/1345 438/26 |

* cited by examiner

200

200

US 11,412,613 B2

FLEXIBLE PRINTED CIRCUIT AND MANUFACTURE METHOD THEREOF, ELECTRONIC DEVICE MODULE AND ELECTRONIC DEVICE

This application claims priority of Chinese Patent Application No. 201910093325.1, filed on Jan. 30, 2019. For all purposes, the entire disclosure of the aforementioned application is incorporated by reference as part of the disclosure of this application.

TECHNICAL FIELD

Embodiments of the present disclosure relate to a flexible printed circuit and a manufacture method thereof, an electronic device module and an electronic device.

BACKGROUND

Flexible printed circuit (FPC) is a kind of printed circuit board with high reliability and flexibility made of a flexible film as the base material. The flexible printed circuit has characteristics of high wiring density, light weight, thin thickness, good bendability, etc., and is widely used in various electronic devices, such as mobile phones, computers, displays, and so on.

SUMMARY

At least one embodiment of the present disclosure provides a flexible printed circuit, which comprises a main sub-circuit board and a transfer sub-circuit board. The main sub-circuit board comprises a first transfer terminal, a first wiring portion and a second wiring portion, the first transfer terminal comprises a plurality of first contact pads, the first wiring portion and the second wiring portion are spaced apart from each other and are electrically connected to a first group of first contact pads and a second group of first contact pads of the first transfer terminal, respectively; and the transfer sub-circuit board comprises a second transfer terminal and a third wiring portion, the third wiring portion is used for a first functional line, the second transfer terminal comprises a plurality of second contact pads, and the third wiring portion electrically connects a first group of second contact pads and a second group of second contact pads of the second transfer terminal. The transfer sub-circuit board is configured to be mounted on the main sub-circuit board by electrically connecting the first group of second contact pads of the second transfer terminal to the first group of first contact pads of the first transfer terminal and electrically connecting the second group of second contact pads of the second transfer terminal to the first group of first contact pads of the first transfer terminal.

For example, in the flexible printed circuit provided by at least one embodiment of the present disclosure, the transfer sub-circuit board is mounted on the main sub-circuit board, so that the first wiring portion, the third wiring portion and the second wiring portion are sequentially and electrically connected with one another to obtain the first functional line.

For example, the flexible printed circuit provided by at least one embodiment of the present disclosure further comprises a first control circuit connecting structure, the first control circuit connecting structure is provided on the main sub-circuit board and is electrically connected to the first wiring portion, or the first control circuit connecting combination structure is provided on the transfer sub-circuit board and is electrically connected to the third wiring portion; and the first control circuit connecting structure is configured to provide a first electrical signal to the first functional line or receive a first electrical signal from the first functional line.

For example, in the flexible printed circuit provided by at least one embodiment of the present disclosure, the main sub-circuit board further comprises a second functional line, the second functional line is electrically connected to the first control circuit connecting structure provided on the main sub-circuit board, and the first control circuit connecting structure is further configured to provide a second electrical signal to the second functional line or receive a second electrical signal from the second functional line.

For example, in the flexible printed circuit provided by at least one embodiment of the present disclosure, the main sub-circuit board further comprises a third functional line, and the third functional line is electrically connected to a third group of first contact pads of the first transfer terminal, the transfer sub-circuit board further comprises a fourth wiring portion, and the fourth wiring portion is electrically connected to a third group of second contact pads of the second transfer terminal, and the third functional line is electrically connected to the fourth wiring portion of the transfer sub-circuit board through the third group of first contact pads of the first transfer terminal and the third group of second contact pads of the second transfer terminal.

For example, in the flexible printed circuit provided by at least one embodiment of the present disclosure, the third functional line is between the first wiring portion and the second wiring portion, and the third group of first contact pads is between the first group of first contact pads and the second group of first contact pads.

For example, in the flexible printed circuit provided by at least one embodiment of the present disclosure, the main sub-circuit board comprises a first substrate, a first wiring layer and a first insulating layer, the first wiring layer and the first insulating layer are stacked on a side of the first substrate, the first wiring layer comprises the first wiring portion, the second wiring portion, the second functional line and the first transfer terminal, and the plurality of first contact pads of the first transfer terminal are exposed by the first insulating layer.

For example, in the flexible printed circuit provided by at least one embodiment of the present disclosure, the transfer sub-circuit board comprises: a second substrate, a second wiring layer and a second insulating layer that are on a first side of the second substrate, wherein the second wiring layer comprises the third wiring portion; and a third wiring layer and a third insulating layer that are on a second side of the second substrate. The third wiring layer comprises the fourth wiring portion and the second transfer terminal, the plurality of second contact pads of the second transfer terminal are exposed by the third insulating layer, and two opposite terminals of the third wiring portion are electrically connected to the first group of second contact pads and the second group of second contact pads of the second transfer terminal through openings, respectively; the second side is opposite to the first side.

For example, in the flexible printed circuit provided by at least one embodiment of the present disclosure, the transfer sub-circuit board comprises: a second substrate, a second wiring layer and a second insulating layer that are on a first side of the second substrate, in which the second wiring layer comprises the third wiring portion and the second transfer terminal, the plurality of second contact pads of the second transfer terminal are exposed by the second insulating layer; and a third wiring layer and a third insulating layer that are on a second side of the second substrate, in which the third wiring layer comprises the fourth wiring portion, and the fourth wiring portion is electrically connected to the third group of second contact pads of the second transfer terminal through an opening. The second side is opposite to the first side.

For example, in the flexible printed circuit provided by at least one embodiment of the present disclosure, the second side is closer to the main sub-circuit board than the first side.

For example, in the flexible printed circuit provided by at least one embodiment of the present disclosure, the transfer sub-circuit board further comprises a shielding layer between the second wiring layer and the third wiring layer For example, in the flexible printed circuit provided by at least one embodiment of the present disclosure, the second transfer terminal of the transfer sub-circuit board is connected to the first transfer terminal of the main sub-circuit board through an anisotropic conductive adhesive, a solder material, or a connector.

At least one embodiment of the present disclosure provides an electronic device module, which comprises an electronic device substrate and any one of the above flexible printed circuits; the electronic device substrate comprises a first functional circuit structure, and the first functional line of the flexible printed circuit is electrically connected to the first functional circuit structure.

For example, in the electronic device module provided by at least one embodiment of the present disclosure, the flexible printed circuit further comprises a second functional line, the first functional circuit structure comprises a first signal transmission portion and a second signal transmission portion, the first functional line is electrically connected to the first signal transmission portion, and the second functional line is electrically connected to the second signal transmission portion.

For example, in the electronic device module provided by at least one embodiment of the present disclosure, the electronic device substrate further comprises a second functional circuit structure, the flexible printed circuit further comprises a third functional line, and the third functional line is electrically connected to the second functional circuit structure.

For example, in the electronic device module provided by at least one embodiment of the present disclosure, the first functional circuit structure is a touch circuit structure, and the second functional circuit structure is a display circuit structure.

For example, in the electronic device module provided by at least one embodiment of the present disclosure, the first signal transmission portion is a touch driving circuit of the touch circuit structure, and the second signal transmission portion is a touch sensing circuit of the touch circuit structure; or the first signal transmission portion is the touch sensing circuit of the touch circuit structure, and the second signal transmission portion is the touch driving circuit of the touch circuit structure.

At least one embodiment of the present disclosure provides an electronic device, which comprises any one of the above electronic device modules.

At least one embodiment of the present disclosure provides a manufacture method of a flexible printed circuit, which comprises: providing a main sub-circuit board, in which the main sub-circuit board comprises a first transfer terminal, a first wiring portion and a second wiring portion, the first transfer terminal comprises a plurality of first contact pads, the first wiring portion and the second wiring portion are spaced apart from each other and are electrically connected to a first group of first contact pads and a second group of first contact pads of the first transfer terminal, respectively; providing a transfer sub-circuit board, in which the transfer sub-circuit board comprises a second transfer terminal and a third wiring portion, the third wiring portion is used for a first functional line, the second transfer terminal comprises a plurality of second contact pads, and the third wiring portion electrically connects a first group of second contact pads with a second group of second contact pads of the second transfer terminal; and mounting the transfer sub-circuit board on the main sub-circuit board by electrically connecting the first group of second contact pads of the second transfer terminal to the first group of first contact pads of the first transfer terminal and electrically connecting the second group of second contact pads of the second transfer terminal to the second group of first contact pads of the first transfer terminal.

For example, in the manufacture method provided by at least one embodiment of the present disclosure, the second transfer terminal of the transfer sub-circuit board is connected to the first transfer terminal of the main sub-circuit board by a method of hot pressing or soldering, or by a connector.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
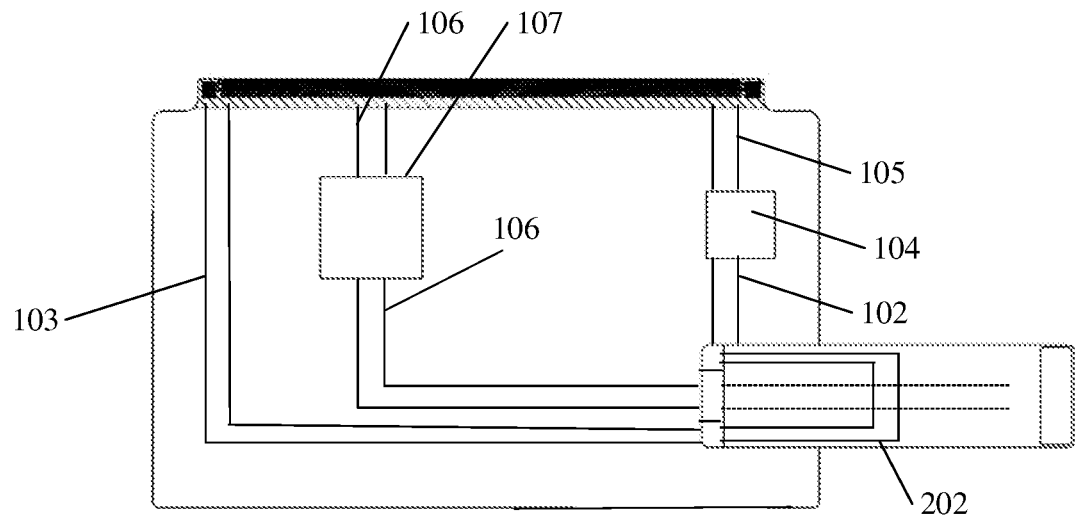
FIG. 1 is a planar diagram of a flexible printed circuit provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Generally, a variety of signal lines are integrated on a flexible printed circuit to transmit different types of signals. In a situation that many types of signal lines on the flexible printed circuit, for example, signal lines for display signals, touch signals, fingerprint recognition signals, or the like are required at the same time, the wiring difficulty on the flexible printed circuit is increased. In this case, the flexible printed circuit is often formed to include multiple wiring layers, such as four wiring layers or six wiring layers, so as to facilitate the arrangement of various wires, so that various wires can be distributed on different layers, thereby reducing the mutual interference between different types of wires. However, in the process of manufacturing the flexible printed circuit with multiple wiring layers, it is necessary to form an insulating layer (and a corresponding adhesive layer) between adjacent wiring layers. If necessary, in order to avoid signal crosstalk between different wires, it is also possible to form a (electromagnetic signal) shielding layer between different wires, which increase the manufacturing difficulty of the flexible printed circuit.

At least one embodiment of the present disclosure provides a flexible printed circuit, which comprises a main sub-circuit board and a transfer sub-circuit board. The main sub-circuit board comprises a first transfer terminal, a first wiring portion and a second wiring portion, the first transfer terminal comprises a plurality of first contact pads, the first wiring portion and the second wiring portion are spaced apart from each other and are electrically connected to a first group of first contact pads and a second group of first contact pads of the first transfer terminal, respectively. The transfer sub-circuit board comprises a second transfer terminal and a third wiring portion, the third wiring portion is used for a first functional line, the second transfer terminal comprises a plurality of second contact pads, and the third wiring portion electrically connects a first group of second contact pads to a second group of second contact pads of the second transfer terminal. The transfer sub-circuit board is configured to electrically connect the first group of second contact pads and the second group of second contact pads of the second transfer terminal to the first group of first contact pads and the second group of first contact pads of the first transfer terminal, respectively, so as to be installed on the main sub-circuit board.

At least one embodiment of the present disclosure provides an electronic device module, which comprises an electronic device substrate and the above flexible printed circuit; the electronic device substrate comprises a first functional circuit structure, and the first functional line of the flexible printed circuit is electrically connected to the first functional circuit structure.

At least one embodiment of the present disclosure provides an electronic device, which comprises the above electronic device module.

The flexible printed circuit board and the manufacture method thereof, the electronic device module, and the electronic device provided by the present disclosure are described below through several specific embodiments.

Some embodiments of the present disclosure provide a flexible printed circuit. FIG. 1 is a planar diagram of the flexible printed circuit. As shown in FIG. 1, the flexible printed circuit 10 comprises a main sub-circuit board 100 and a transfer sub-circuit board 200. The transfer sub-circuit board 200 may be installed on the main sub-circuit board 100.

Figure 2:
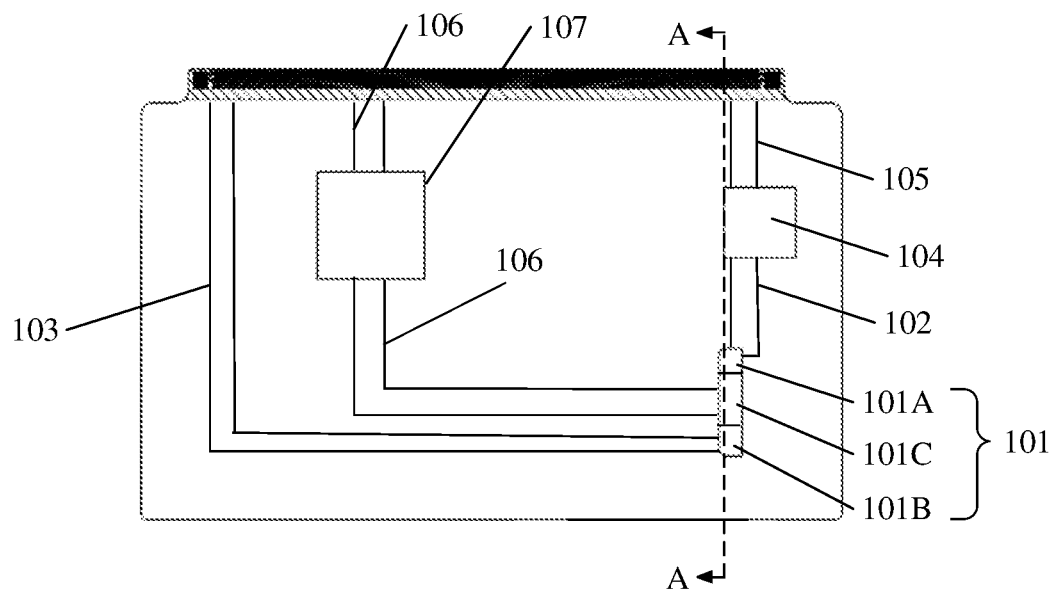
FIG. 2 is a planar diagram of a main sub-circuit board of a flexible printed circuit provided by some embodiments of the present disclosure.

FIG. 2 is a planar diagram of the main sub-circuit board 100 in some embodiments of the present disclosure. As shown in FIG. 2, the main sub-circuit board 100 comprises a first transfer terminal 101, a first wiring portion 102, and a second wiring portion 103. The first transfer terminal 101 comprises a plurality of first contact pads, and the plurality of first contact pads are divided into a plurality of groups as required, so as to be electrically connected to wirings for transmitting different signals, respectively. For example, the plurality of first contact pads are arranged in one row or multiple rows. The first wiring portion 102 and the second wiring portion 103 are spaced apart from each other. The first wiring portion 102 is electrically connected to a first group of first contact pads 101A of the first transfer terminal 101, and the second wiring portion 103 is electrically connected to a second group of first contact pads 101B of the first transfer terminal 101. For example, the first wiring portion 102 comprises a plurality of wirings, and terminals of the plurality of wirings are electrically connected to the plurality of contact pads in the first group of first contact pads 101A of the first transfer terminal 101 in one-to-one correspondence. The second wiring portion 103 also comprises a plurality of wirings, and terminals of the plurality of wirings are electrically connected to the plurality of contact pads in the second group of first contact pads 101B in one-to-one correspondence. Although only two wirings of the first wiring portion 102 and two wirings of the second wiring portion 103 are shown in the figure, the embodiments of the present disclosure are not limited thereto.

Figure 3A:
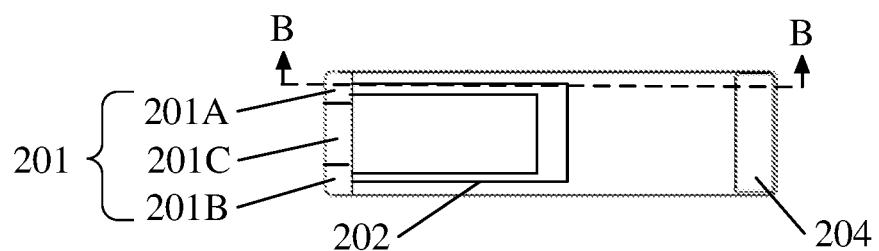
FIG. 3A is a planar diagram of a first side of a transfer sub-circuit board of a flexible printed circuit provided by some embodiments of the present disclosure.

FIG. 3A is a planar diagram of a first side of a transfer sub-circuit board 200 provided by some embodiments of the present disclosure. As shown in FIG. 3A, the transfer sub-circuit board 200 comprises a second transfer terminal 201 and a third wiring portion 202. The second transfer terminal 201 comprises a plurality of second contact pads, and the plurality of second contact pads are divided into a plurality of groups as required, so as to be electrically connected to wirings for transmitting different signals, respectively. For example, the plurality of second contact pads are arranged in a row. The third wiring portion 202 electrically connects a first group of second contact pads 201A to a second group of second contact pads 201B of the second transfer terminal 201. More specifically, the third wiring portion 202 comprises a plurality of wirings, and the plurality of wirings are electrically connected to the plurality of contact pads in the first group of second contact pads 201A at terminals in one-to-one correspondence, and are connected to the plurality of contact pads in the second group of contact pads 201B at the other terminals in one-to-one correspondence. Although only two wirings in the third wiring portion 202 are shown in the figure, the embodiments of the present disclosure are not limited thereto.

The transfer sub-circuit board 200 is configured to electrically connect the first group of second contact pads 201A and the second group of second contact pads 201B of the second transfer terminal 201 to the first group of contact pad 101A and the second group of first contact pads 101B of the first transfer terminal 101, respectively, so that the transfer sub-circuit board 200 can be installed on the main sub-circuit board 100. For example, in the example shown in FIG. 3A, the first wiring portion 102, the third wiring portion 202, and the second wiring portion 103 are electrically connected in serial to obtain the first functional line, and thus electrical signals can be transmitted from the first wiring portion 102 to the second wiring portion 103 through the third wiring portion 202, or transmitted from the second wiring portion 103 to the first wiring portion 102 through the third wiring portion 203.

For example, FIG. 1 shows the case that the transfer sub-circuit board 200 is installed on the main sub-circuit board 100 by coupling the first group of second contact pads 201A and the second group of second contact pad pads 201B with the first group of first contact pads 101A and the second group of first contact pads 101B of the first transfer terminal 101. In some embodiments, the main sub-circuit board 100 and the transfer sub-circuit board 200 may also be in a state to be connected, that is, the main sub-circuit board 100 and the transfer sub-circuit board 200 which are separated from each other are also within the protection scope of the present disclosure.

For example, in some embodiments, as shown in FIG. 2, the flexible printed circuit 10 further comprises a first control circuit connecting structure 104 disposed on the main sub-circuit board 100. For example, the first control circuit connecting structure 104 comprises a plurality of contact pads for mounting a first control circuit, and a portion of the plurality of contact pads are electrically connected to the other terminals of the plurality of wirings in the first wiring portion 102 in one-to-one correspondence. The first control circuit connecting structure 104 is configured to provide a first electrical signal to the first functional line or receive a first electrical signal from the first functional line.

For example, the first control circuit may be a driving integrated circuit (IC) chip. There are many methods (i.e, packaging methods) to connect the driving IC chip to the flexible printed circuit, such as Tape Carrier Package (TCP), Chip On Film (COF) package, etc. In the TCP method, the flexible printed circuit comprises a plurality of contact pads, and a plurality of pins of the driving IC chip and the plurality of contact pads of the flexible printed circuit are soldered (such as eutectic soldering) in one-to-one correspondence, or electrically connected through an anisotropic conductive adhesive (ACF) in one-to-one correspondence, and at least the soldered portion is protected by, for example, epoxy resin; in order to increase the bendability of the flexible printed circuit obtained from the TCP method, a slit may be formed in the package portion. In the COF packaging method, the flexible printed circuit comprises a plurality of contact pads, and a plurality of pins of the driving IC chip are directly pressed on the plurality of contact pads of the flexible printed circuit through the ACF, so that the plurality of pins of the driving IC chip and the plurality of contact pads of the flexible printed circuit are electrically connected in one-to-one correspondence. For example, the size and arrangement of the contact pads on the flexible printed circuit used to connect with the driving IC chip can be adjusted according to different types of packaging methods or the driving IC chip to be packaged, for example, the contact pads may be arranged in a long strip shape or a rectangle shape. The embodiments of the present disclosure do not limit the packaging method of the driving IC chip.

For example, in some embodiments, as shown in FIG. 2, the main sub-circuit board 100 of the flexible printed circuit 10 further comprises a second functional line 105, the second functional line 105 comprises a plurality of wirings, and another portion of the contact pads in the first control circuit connecting structure 104 is electrically connected to the plurality of wirings of the second functional line 105 in one-to-one correspondence. In this case, the first control circuit connected to the first control circuit connecting structure 104 is further configured to provide a second electrical signal to the second functional line 105 or receive a second electrical signal from the second functional line 105.

For example, in some embodiments, as shown in FIG. 2, the main sub-circuit board 100 further comprises a third functional line 106. The third functional line 106 comprises a plurality of wirings, which are electrically connected to the plurality of contact pads in the third group of first contact pads 101C of the first transfer terminal 101 in one-to-one correspondence.

Figure 3B:
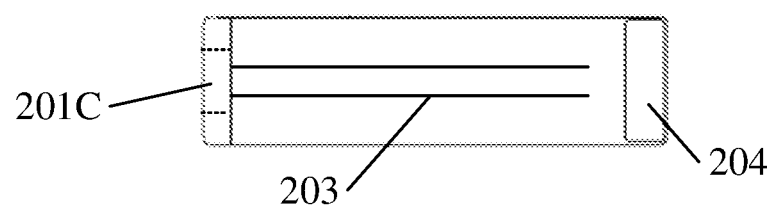
FIG. 3B is a planar diagram of a second side of a transfer sub-circuit board of a flexible printed circuit provided by some embodiments of the present disclosure.

For example, as shown in FIG. 3B, the transfer sub-circuit board 200 further comprises a fourth wiring portion 203, and the fourth wiring portion 203 comprises a plurality of wirings, which are electrically connected to the plurality of contact pads in the third group of second contact pad 201C of the second transfer terminal 201 in one-to-one correspondence. Thus, the third functional line 106 is electrically connected to the fourth wiring portion 203 of the transfer sub-circuit board 200 through the third group of first contact pads 101C of the first transfer terminal 101 and the third group of second contact pads 201C of the second transfer terminal 201. For example, FIG. 3B is a planar diagram of the second side of the transfer sub-circuit board 200. In this case, the third wiring portion 202 and the fourth wiring portion 203 are respectively provided on two sides of the transfer sub-circuit board 200. Thus, the signal crosstalk between the third wiring portion 202 and the fourth wiring portion 203 can be avoided.

For example, in some embodiments, as shown in FIG. 3A and FIG. 3B, the transfer sub-circuit board 200 further comprises a third transfer terminal 204, and the third transfer terminal 204 is opposite to the second transfer terminal 201. For example, the third transfer terminal 204 comprises a plurality of contact pads, for example, the plurality of contact pads are electrically connected to the plurality of wirings of the fourth wiring portion 203 in one-to-one correspondence and are configured for electrically connecting with other electronic components, such as a system circuit board, an user terminal, or the like, which are not limited in the embodiments of the present disclosure.

For example, in some embodiments, as shown in FIG. 2, the third functional line 106 on the main sub-circuit board 100 is located between the first wiring portion 102 and the second wiring portion 103, and the third group of first contact pads 101C are located between the first group of first contact pads 101A and the second group of first contact pads 101B. Thus, the third functional line 106 does not intersect the first wiring portion 102 and the second wiring portion 103, thereby avoiding the formation of crossed wirings on the main sub-circuit board 100 itself, thereby avoiding or weakening signal crosstalk between different wirings, or eliminating the need for additional functional layers to prevent signal crosstalk, thereby avoiding the complexity of the circuit board structure; in addition, this design can also simplify the layout of the wirings on the main sub-circuit board 100, so that the manufacture process of the main sub-circuit board becomes simple.

For example, in some embodiments, as shown in FIG. 2, the flexible printed circuit 10 further comprises a second control circuit connecting structure 107 disposed on the main sub-circuit board 100. For example, the second control circuit connecting structure 107 comprises a plurality of contact pads for mounting a second control circuit, and at least a part of the plurality of contact pads is electrically connected to a terminal of the third functional line 106 in one-to-one correspondence. The second control circuit connecting structure 107 is configured to provide a third electrical signal to the third functional line 106 or receive a third electrical signal from the third functional line 106. For example, the third functional line 106 is divided into two parts. One part of the third functional line 106 is used to electrically connect the second control circuit connecting structure 107 with the third group of first contact pads 101C, and the other part is used to electrically connect the second control circuit connecting structure 107 with the contact pads (described below) formed on a side edge of the main sub-circuit board 100.

For example, the second control circuit may be a driving IC chip. The first control circuit and the second control circuit are used to implement different driving functions. As described above, the method in which the driving IC chip is connected to the flexible printed circuit is, for example, a Tape Carrier Package (TCP), a Chip On Film (COF) package, or the like. For example, the second control circuit connecting structure 107 comprises a plurality of contact pads for connecting the driving IC chip. Similarly, the size and arrangement of the contact pads can be adjusted according to different types of packaging methods or the driving IC chip to be packaged, which is not specifically limited in the embodiments of the present disclosure.

Figure 4A:
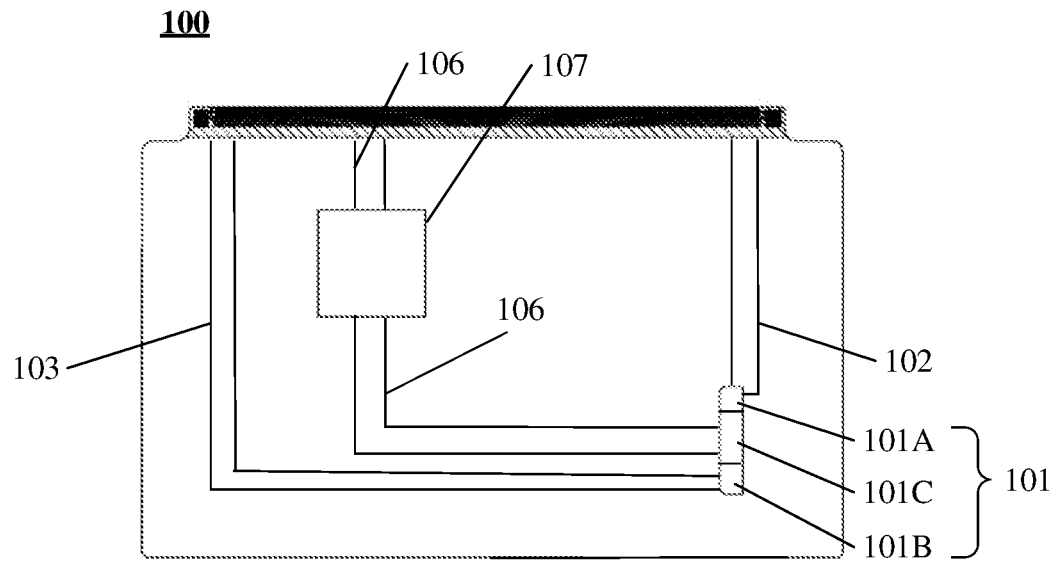
FIG. 4A is a planar diagram of a main sub-circuit board of a flexible printed circuit provided by some other embodiments of the present disclosure.
Figure 4B:
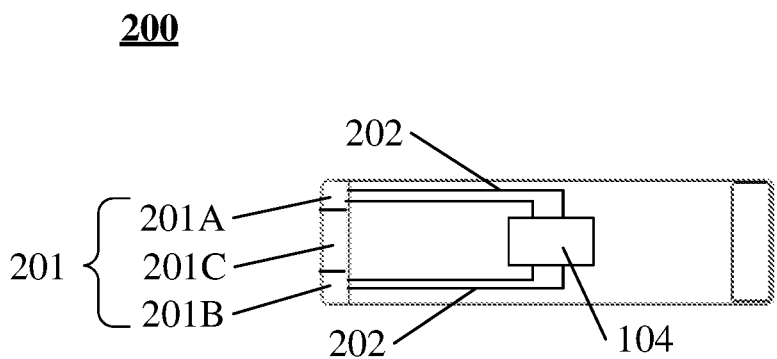
FIG. 4B is a planar diagram of a first side of a transfer sub-circuit board of a flexible printed circuit provided by some other embodiments of the present disclosure.

For example, as shown in FIG. 4A and FIG. 4B, in some embodiments, the first control circuit connecting structure 104 may also be formed on the transfer sub-circuit board 200. In this case, the third wiring portion 202 is divided into two parts, one part of the third wiring portion 202 is used to electrically connect the first control circuit connecting structure 104 with the first group of second contact pads 201A, and the other part of the third wiring portion 202 is used to electrically connect the first control circuit connecting structure 104 with the second group of second contact pads 201B. In this case, on the main sub-circuit board 100, the first wiring portion 102 and the second wiring portion 103 are electrically connected to the first group of first contact pads 101A and the second group of first contact pads 101B of the first transfer terminal 101, respectively; on the transfer sub-board 200, one terminal of each part of the third wiring portion 202 is electrically connected to the first control circuit connecting structure 104, and the other terminal is electrically connected to the first group of first contact pads 101A or the second group of first contact pads 101B. Thus, the first wiring portion 102 and the second wiring portion 103 on the main sub-circuit board 100 are electrically connected to the first control circuit connecting structure 104 on the transfer sub-circuit board 200, respectively.

For example, in some embodiments, the main sub-circuit board may have a single-layer structure with a single wiring layer or a multi-layer structure with multiple wiring layers (for example, a double-layer structure with double wiring layers or a three-layer structure with three wiring layers, etc.), the embodiments of the present disclosure are not limited in this aspect.

Figure 5A:
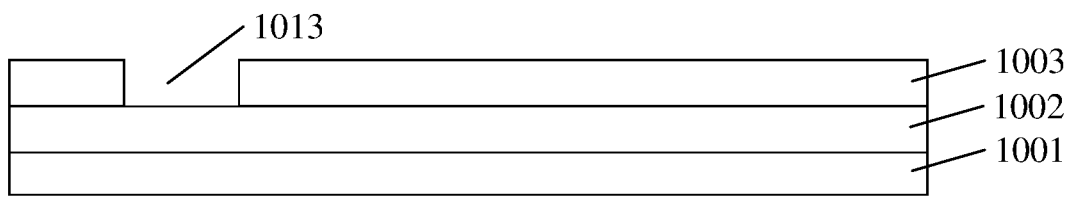
FIG. 5A is a cross-sectional diagram of a main sub-circuit board of a flexible printed circuit provided by some embodiments of the present disclosure.

For example, FIG. 5A shows a cross-sectional diagram of a main sub-circuit board provided by some embodiments of the present disclosure, for example, the cross-sectional diagram is obtained by cutting along the line A-A in FIG. 2. In these embodiments, the main sub-circuit board 100 has a single-layer structure.

As shown in FIG. 5A, the main sub-circuit board 100 comprises a first substrate 1001, a first wiring layer 1002 and a first insulating layer 1003 that are stacked on a side of the first substrate 1001. The first wiring layer 1002 comprises the first wiring portion 102, the second wiring portion 103, the second functional line 105, the first transfer terminal 101, and the like, the first transfer terminal 101 is exposed by the first insulating layer 1003. For example, the first insulating layer 1003 serves as a protective layer to provide structural and electrical protection to the first wiring layer 1002. For example, the first insulating layer 1003 may be attached to the first wiring layer 1002 and the first substrate 1001 through an adhesive layer (not shown); an opening 1013 is formed in the first insulating layer 1003, and in the opening 1013, for example, a portion of the exposed first wiring layer 1002 corresponding to the first transfer terminal 101 can be surface-treated (for example, plating a solder layer), thereby forming a plurality of patterned contact pads, and correspondingly forming the first transfer terminal 101.

Figure 5B:
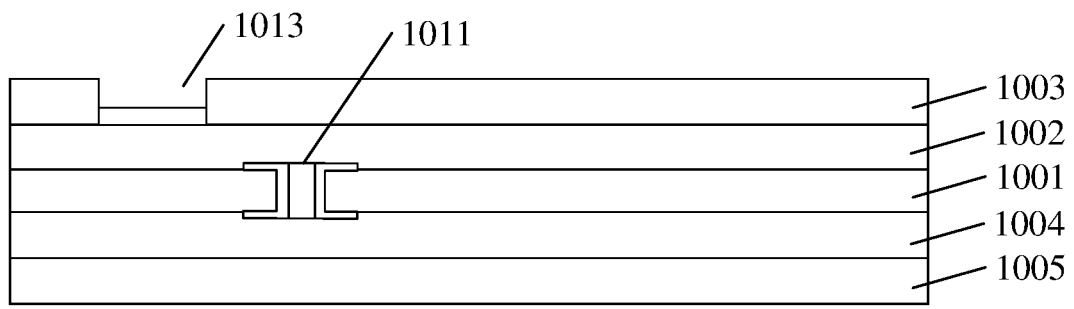
FIG. 5B is a cross-sectional diagram of another main sub-circuit board of a flexible printed circuit provided by some embodiments of the present disclosure.

For example, FIG. 5B shows a cross-sectional diagram of another main sub-circuit board provided by some embodiments of the present disclosure, for example, the cross-sectional diagram is obtained by cutting along the line A-A in FIG. 2. In these embodiments, the main sub-circuit board 100 has a multi-layer structure. The following describes the main sub-circuit board 100 having a double-layer structure as an example with reference to FIG. 5B, but the embodiments of the present disclosure are not limited in the aspect.

As shown in FIG. 5B, in this example, the main sub-circuit board 100 comprises a first substrate 1001, a first wiring layer 1002 and a first insulating layer 1003 that are stacked on a first side (shown as the upper side in the figure) of the first substrate 1001, and further comprises a second wiring layer 1004 and a second insulating layer 1005 that are stacked on a second side (shown as the lower side in the figure) of the first substrate 1001. The first insulating layer 1003 serves as a protective layer to provide structural and electrical protection to the first wiring layer 1002. For example, the first insulating layer 1003 may be attached to the first wiring layer 1002 and the substrate 1001 through an adhesive layer (not shown). The second insulating layer 1005 serves as a protective layer to provide structural and electrical protection to the second wiring layer 1004, for example, the second insulating layer 1005 can be attached to the second wiring layer 1004 and the first substrate 1001 through an adhesive layer (not shown).

For example, the first wiring portion 102, the second wiring portion 103, and the third functional line 106 are arranged alternately in the first wiring layer 1002 and the second wiring layer 1004, that is, each of the first wiring layer 1002 and the second wiring layer 1004 has the first wiring portion 102, the second wiring portion 103, and the third functional line 106, for example, two adjacent wirings of the first wiring portion 102 on the board surface of the main sub-circuit board 100 may be located in the first wiring layer 1002 and the second wiring layer 1004, respectively, thereby facilitating layout of the wirings, and the second wiring portion 103 and the third functional line 106 may be similarly arranged. For another example, in some examples, the first wiring layer 1002 comprises the first wiring portion 102 and the second wiring portion 103, and the second wiring layer 1004 comprises the third functional line 106, that is, different functional wirings may be arranged in different layers, respectively. The embodiments of the present disclosure do not specifically limit the layout of the wirings on the main sub-circuit board 100.

For example, the plurality of first contact pads of the first transfer terminal 101 are exposed by the first insulating layer 1003. For example, similarly, an opening 1013 is formed in the first insulating layer 1003, and in the opening 1013, for example, a portion of the exposed first wiring layer 1002 corresponding to the first transfer terminal 101 may be surface-treated to form the plurality of patterned contact pads, and correspondingly forming the first transfer terminal 101. Similarly, for the wirings in the second wiring layer 1004, the transfer terminal can be formed by the wirings passing through a via hole 1011 in the first substrate 1001, the second wiring layer 1004, and the opening 1013 in the first insulating layer 1003. For example, the via hole 1011 in the first substrate 1001 and the opening 1013 in the first insulating layer 1003 are arranged in a staggered manner. Thus, in the manufacture process, the position of the opening 1013 is relatively flat, which facilitates the formation of the contact pads.

For example, in some embodiments, the main sub-circuit board may also have a multi-layer structure such as a three-layer structure or a four-layer structure. In this case, each wiring portion on the main sub-circuit board, for example, the first wiring portion, the second wiring portion, the second functional line, and the third functional line may be arranged in multiple wiring layers. For example, the first wiring portion, the second wiring portion, the second functional line, and the third functional line are alternately arranged in the multiple wiring layers, or are respectively arranged in different wiring layers. The embodiments of the present disclosure do not specifically limit the number of the wiring layers of the main sub-circuit board and the arrangement of the wirings.

Similarly, the transfer sub-circuit board may have a double-layer structure with double wiring layers or a multi-layer structure with more than two wiring layers.

Figure 6A:
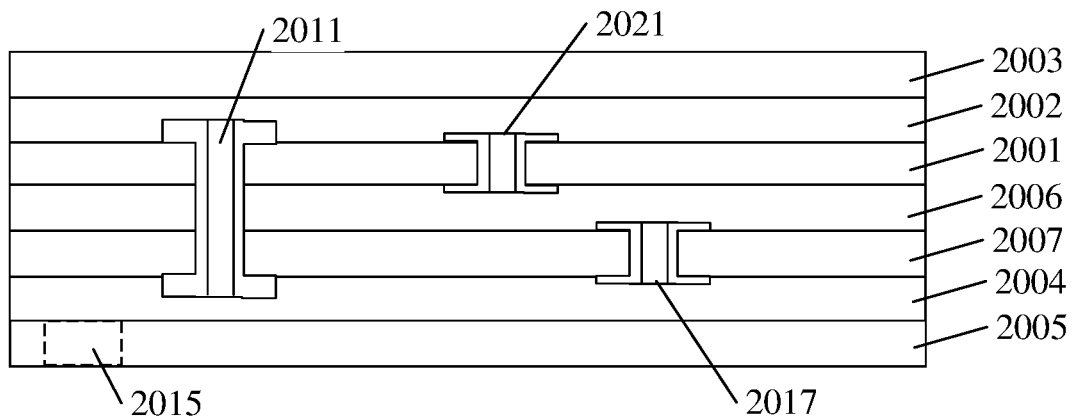
FIG. 6A is a cross-sectional diagram of a transfer sub-circuit board of a flexible printed circuit provided by some embodiments of the present disclosure.

For example, FIG. 6A shows a cross-sectional diagram of a transfer sub-circuit board 200 provided by some embodiments of the present disclosure, for example, the cross-sectional diagram is obtained by cutting along the line B-B in FIG. 3. As shown in FIG. 6A, the transfer sub-circuit board 200 comprises a second substrate 2001, a second wiring layer 2002 and a second insulating layer 2003 that are on a first side (shown as the upper side in the figure) of the second substrate 2001, a third wiring layer 2004 and a third insulating layer 2005 that are on a second side (shown as the lower side in the figure) of the second substrate 2001. Similarly, the second insulating layer 2003 and the third insulating layer 2005 serve as protective layers to provide structural and electrical protection to the second wiring layer 2002 and the third wiring layer 2004. For example, the second insulating layer 2003 and the third insulating layer 2005 may be attached to the second wiring layer 2002 and the third wiring layer 2004 through adhesive layers (not shown in the figure), respectively.

For example, the second wiring layer 2002 comprises the third wiring portion 202; the third wiring layer 2004 comprises the fourth wiring portion 203 and the second transfer terminal 201, so that the third wiring portion 202 and the fourth wiring portion 203 are arranged in different wiring layers. For example, the plurality of second contact pads of the second transfer terminal 201 are exposed by the third insulating layer 2005, and two opposite terminals of the third wiring portion 202 are electrically connected to the first group of second contact pads 201A and the second group of second contact pads 201B of the second transfer terminal 201 through openings, respectively. For example, the third wiring portion 202 is exposed and led out through a via hole 2011 in the second substrate 2001 and an opening 2015 in the third insulating layer 2005, for example, the plurality of patterned contact pads are formed by surface treatment, so as to constitute the transfer terminal. For example, the opening 2015 in the third insulating layer 2005 is formed at the position indicated by the dotted frame shown in FIG. 6A or at another suitable position, which is not limited in the embodiments of the present disclosure. For example, the via hole 2011 in the second substrate 2001 and the opening 2015 in the third insulating layer 2005 are arranged in a staggered manner, so that in the manufacture process, the position of the opening 2015 is relatively flat, which facilitates the formation of the contact pads.

Figure 6B:
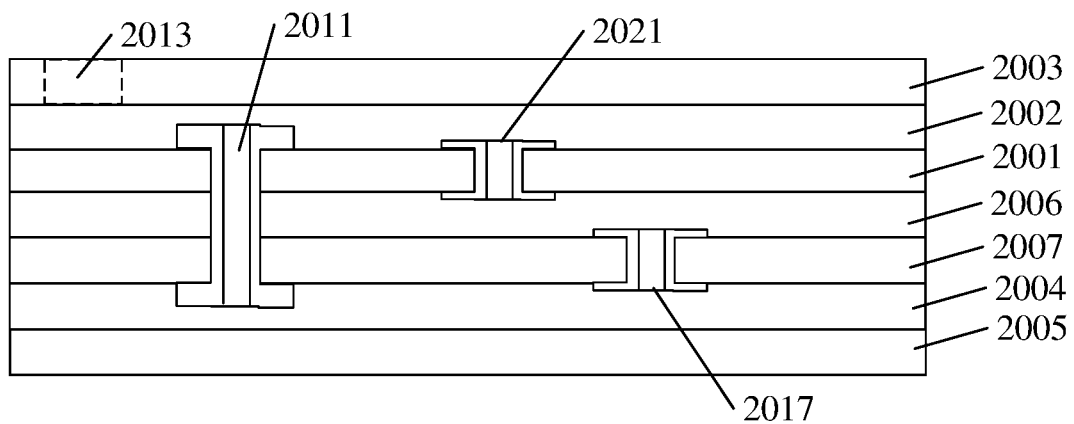
FIG. 6B is a cross-sectional diagram of another transfer sub-circuit board of a flexible printed circuit provided by some embodiments of the present disclosure.

For example, in another example, FIG. 6B shows a cross-sectional diagram of another transfer sub-circuit board provided by some embodiments of the present disclosure, for example, the cross-sectional diagram is obtained by cutting along the line B-B in FIG. 3A. As shown in FIG. 6B, the transfer sub-circuit board comprises a second substrate 2001, a second wiring layer 2002 and a second insulating layer 2003 that are on a first side of the second substrate 2001, a third wiring layer 2004 and a third insulating layer 2005 that are on the second side of the second substrate 2001. The second wiring layer 2002 comprises the third wiring portion 202 and the second transfer terminal 201. The plurality of second contact pads of the second transfer terminal 201 are exposed by the second insulating layer 2003. The third wiring layer 2004 comprises the fourth wiring portion 203, and the fourth wiring portion 203 is electrically connected to the third group of second contact pads 201C of the second transition terminal 201 through an opening. For example, the fourth wiring portion 203 is exposed and led out through the via hole 2011 in the second substrate 2001 and the opening 2013 in the second insulating layer 2003, for example, the plurality of patterned contact pads are formed by surface treatment, so as to constitute the transfer terminal. For example, the opening 2013 in the second insulating layer 2003 is formed at the position indicated by the dotted frame shown in FIG. 6B or at another suitable position, which is not limited in the embodiments of the present disclosure. For example, the via hole 2011 in the second substrate 2001 and the opening 2013 in the second insulating layer 2003 are arranged in a staggered manner.

Thus, in the manufacture process, the position of the opening 2013 is relatively flat, which facilitates the formation of the contact pads.

For example, the second side is opposite to the first side. While the transfer sub-circuit board 200 is mounted on the main sub-circuit board 100, the second side is closer to the main sub-circuit board 100 than the first side.

For example, in the transfer sub-circuit boards 200 shown in FIG. 6A and FIG. 6B, respectively, the transfer sub-circuit board 200 further comprises a shield layer 2006 between the second wiring layer 2002 and the third wiring layer 2004. For example, the shielding layer 2006 is provided on the first side or the second side of the second substrate 2001, and is insulated from the adjacent wiring layer by a fourth insulating layer 2007. For example, FIG. 6A and FIG. 6B show that the shielding layer 2006 is provided on the second side of the second substrate 2001, and is insulated from the third wiring layer 2004 by the fourth insulating layer 2007. Thus, the shielding layer 2006 can prevent signal crosstalk from being generated between the wirings on both sides of the second substrate 2001 of the transfer sub-circuit board 200. For example, the shielding layer 2006 and the fourth insulating layer 2007 have a hollow structure at a position corresponding to the transfer terminal. For example, the hollow structure communicates with the via hole 2011 to facilitate leading out of the wirings and forming the transfer terminal.

For example, the second substrate 2001 further has another via hole 2021, and the shield layer 2006 is electrically connected to a ground line in the second wiring layer 2002 through the via hole 2021, so that the shield layer 2006 is grounded, and can play a shielding role. For another example, the fourth insulating layer 2007 has a via hole 2017, and the shield layer 2006 is electrically connected to a ground line in the third wiring layer 2004 through the via hole 2017, so that the shield layer 2006 is grounded.

For example, in another embodiment, the transfer sub-circuit board 200 may further have more wiring layers, for example, two wiring layers on the first side of the second substrate 2001, in this case, the wirings on the first side of the second substrate 2001 may be alternately arranged in the above two wiring layers, or different wirings are respectively arranged in different wiring layers. For example, the transfer sub-circuit board 200 may also have two wiring layers on the second side of the second substrate 2001. In this case, the wirings on the second side of the second substrate 2001 may be alternately arranged in the above two wiring layers, or different wirings are respectively arranged in different wiring layers. The embodiments of the present disclosure do not specifically limit the number of the wiring layers and the specific wiring arrangement of the transfer sub-circuit board 200.

For example, the first substrate 1001 and the second substrate 2001 are made from a material such as polyimide, polyester, or the like. Each wiring layer is made from a metal material or an alloy material such as copper, silver, aluminum, etc. Each insulating layer is made from an insulating material such as polyester, polyimide, or the like. The shielding layer 2006 is made from a metal material such as copper, or the like. The adhesive layer is made from epoxy resin, polyethylene, or the like. The material of each functional layer is not specifically limited in the embodiments of the present disclosure.

For example, in some embodiments, the second transfer terminal 201 of the transfer sub-circuit board 200 is connected to the first transfer terminal 101 of the main sub-circuit board 100 through an anisotropic conductive adhesive, a solder material, or a connector. For example, the connector comprises a Zero Insertion Force (ZIF) connector, a Board To Board (BTB) connector, etc. The embodiments of the present disclosure do not specifically limit the connection method of each transfer terminal.

For example, in one example, the BTB connector is used to connect the main sub-circuit board 100 with the transfer sub-circuit board 200. In this case, the connector comprises a male connector and a female connector that match with each other. For example, the first transfer terminal 101 of the main sub-circuit board 100 is provided with the female connector, and the second transfer terminal 201 of the transfer sub-circuit board 200 is provided with the male connector, so that the male connector and the female connector are interlocked to allow the transfer sub-circuit board 200 to be connected to the main sub-circuit board 100.

The flexible printed circuit provided by the embodiments of the present disclosure comprises a main sub-circuit board and a transfer sub-circuit board. The transfer sub-circuit board is connected to the wirings on both sides of the main sub-circuit board to avoid the wirings on the main sub-circuit board from crossing with each other, and prevent or weaken the signal crosstalk, or eliminating the need for additional functional layers to prevent the signal crosstalk, thereby avoiding the complexity of the circuit board structure. In some embodiments of the present disclosure, the main sub-circuit board and the transfer sub-circuit board have a simple single-layer or double-layer structure, so the layout of the wirings is simpler, and the manufacture difficulty of the main sub-circuit board and the transfer sub-circuit board can be reduced.

Figure 7:
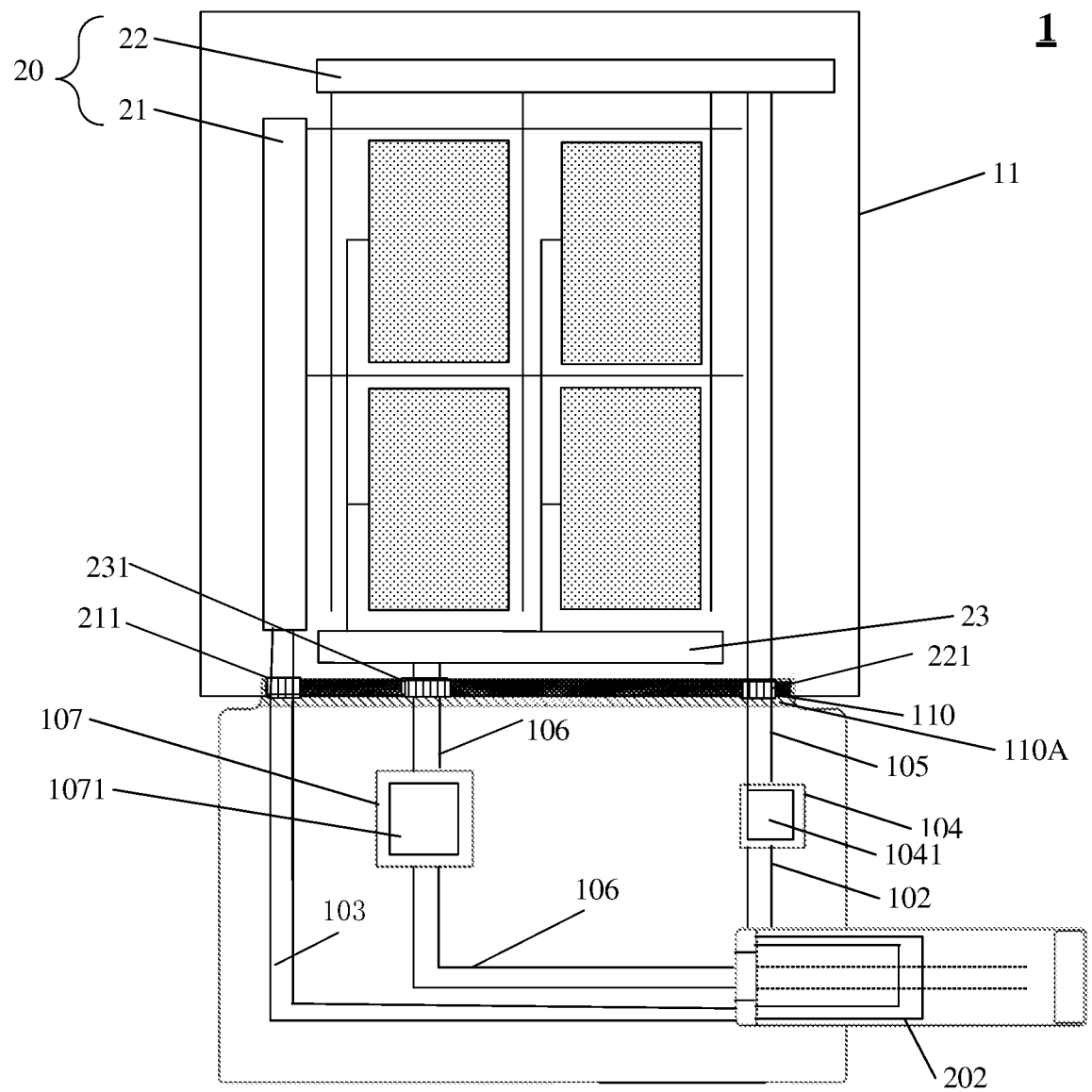
FIG. 7 is a planar diagram of an electronic device substrate provided by some embodiments of the present disclosure.

Some embodiments of the present disclosure provide an electronic device module. FIG. 7 shows a schematic diagram of the electronic device module. As shown in FIG. 7, the electronic device module 1 comprises an electronic device substrate 11 and any one of the flexible printed circuits 10 described above. The electronic device substrate 11 comprises a first functional circuit structure 20. The first functional line (comprising the first wiring portion 102, the second wiring portion 103, and the third wiring portion 202) of the flexible printed circuit 10 is electrically connected to the first functional circuit structure 20.

For example, in some embodiments, the flexible printed circuit 10 further comprises a second functional line 105, the first functional circuit structure 20 comprises a first signal transmission portion 21 and a second signal transmission portion 22, the first functional line is electrically connected to the first signal transmission portion 21, and the second functional line 105 is electrically connected to the second signal transmission portion 22.

For example, in some embodiments, the electronic device substrate 11 further comprises a second functional circuit structure 23, and the flexible printed circuit further comprises a third functional line 106, and the third functional line 106 is electrically connected to the second functional circuit structure 23.

For example, in some embodiments, the electronic device substrate 11 is a substrate having a display function and a touch function. In this case, the first functional circuit structure 20 is a touch circuit structure, and the second functional circuit structure 23 is a display circuit structure. In other embodiments, the electronic device substrate 11 is a substrate having a display function and a fingerprint recognition function. In this case, the first functional circuit structure 20 is a fingerprint recognition circuit structure, for example, the fingerprint recognition circuit structure is a capacitive fingerprint recognition circuit, which comprises a detection driving electrode and a detection sensing electrode intersecting each other, and the second functional circuit structure 23 is a display circuit structure. In the following, the case that the first functional circuit structure 20 is a touch circuit structure is taken as an example for description.

For example, the manner in which the touch circuit structure is provided on the electronic device substrate 11 may be an in-cell type or an on-cell type. The form of the touch circuit structure may be a capacitive type, such as a mutual-capacitive touch circuit structure. For example, the mutual-capacitive touch circuit structure comprises a plurality of first electrodes extending in a first direction and a plurality of second electrodes extending in a second direction (which intersects the first direction). A detection capacitor is formed at the intersecting position of the two groups of electrodes, that is, these two groups of electrodes constitute two electrodes of the capacitor. Where a finger touches the touch circuit structure, the finger affects the coupling state between two electrodes near the touch point, thereby changing the capacitance of the detection capacitor between the two electrodes. According to the capacitance change data of the touch circuit structure and the coordinates of each capacitor, the coordinates of each touch point can be obtained. When detecting the capacitance value of the capacitor, the horizontal electrodes serving as the touch driving circuit sequentially send out excitation signals, and the vertical electrodes serving as the touch sensing circuit receive signals simultaneously or sequentially, so that the capacitance values of all the intersecting points of the horizontal electrodes and vertical electrodes can be obtained, that is, the capacitance values of the entire touch structure on the two-dimensional plane is obtained. Therefore, even if there are multiple touch points on the touch structure, the real coordinates of each touch point can be determined.

For example, in the above case, the first signal transmission portion 21 comprises touch driving wirings electrically connected to the touch driving (Tx) circuit of the touch circuit, and the second signal transmission portion 22 comprises touch sensing wirings electrically connected to the touch sensing (Rx) circuit of the touch circuit. In this case, the first control circuit 1041 is a touch driving IC, which provides excitation signals for the touch driving circuit through the touch driving wirings, and receives sensing signals of the touch sensing circuit through the touch sensing wirings, and determines the touch position based on the above signals and perform a response. For example, the distance between the touch sensing circuit and the first control circuit connecting structure 104 is closer, that is, the touch sensing circuit is closer to the first control circuit 1041 mounted on the first control circuit connecting structure 104, that is, the touch sensing circuit is closer to the touch driving IC, so the transmission path of the sensing signals received by the touch sensing circuit and transmitted to the touch driving IC is shorter, so the sensing signals are less likely to be interfered by other signals, so that the touch operation can be more accurate. For example, as shown in the figure, the touch driving wirings and the touch sensing wirings extend to the same side (the lower side in the figure) of the electronic device substrate 11, and are electrically contacted to the contact pads 211 and the contact pads 221 formed on the same side, respectively.

For example, in other embodiments of the present disclosure, the first signal transmission portion 21 may comprise touch sensing wirings electrically connected to a touch sensing (Rx) circuit of the touch circuit, and the second signal transmission portion 22 may comprise touch driving wirings electrically connected to the touch driving (Tx) circuit of the touch circuit. In this case, the touch driving circuit is directly electrically connected to the first control circuit connecting structure 104, so the touch driving circuit is closer to the first control circuit connecting structure 104, that is, the touch driving circuit is closer to the first control circuit 1041 mounted on the first control circuit connecting structure 104, that is, the touch driving circuit is closer to the touch driving IC, and thus, in this embodiment, the touch driving signals in the touch driving circuit are less likely to be interfered by other signals.

For example, the flexible printed circuit 10 has a wiring connecting terminal 110 on a side (for example, the upper side in the figure), the wiring connecting terminal 110 comprises a plurality of contact pads, and the other terminals of the plurality of wirings in the second wiring portion 103 are electrically connected to a part of the contact pads of the wiring connecting terminal 110 in one-to-one correspondence, and the opposite terminals of the plurality of wirings in the second functional line 105 are electrically connected to another part of the contact pads of the wiring connecting terminal 110 in one-to-one correspondence, and the other terminals of the plurality of wirings in the third functional line 106 are electrically connected to further another part of the contact pads of the wiring connecting terminal 110 in one-to-one correspondence. For example, each part of the contact pads electrically connected to the second wiring portion 103, the third functional line 106, and the second functional line 105, respectively, are arranged at intervals or continuously arranged at the wiring connecting terminal 110, and the embodiments of the present disclosure are not limited in this aspect. For example, in the situation that the number of the wirings in the second wiring portion 103, the third functional line 106, and the second functional line 105 is numerous, the contact pads connected thereto may be continuously arranged on the wiring connecting terminal 110; in the situation that the number of the second wiring portion 103, the third functional line 106, and the second functional line 105 is few, the contact pads connected thereto may be arranged at intervals on the wiring connecting terminal 110. In this case, for example, a plurality of groups of contact pads arranged at intervals shown in FIG. 7 may be formed.

For example, the wiring connecting terminal 110 is provided in a wiring connecting region 110A (that is, the oblique line region below the wiring connecting terminal 110 in the figure) of the main sub-circuit board. For example, the wiring connecting region 110A only has the wiring layer and partial insulating layer, but does not have structures such as the shielding layer and so on. Therefore, the wiring connecting region 110A has high light transparency. In the situation that the flexible printed circuit 10 is connected to the electronic device substrate 11, clear alignment can be achieved, so as to facilitate accurate electrical connection between the flexible printed circuit 10 and the electronic device substrate 11.

For example, in the situation that the flexible printed circuit 10 is connected to the electronic device substrate 11, the contact pads of the wiring connecting terminals 110 on the side of the flexible printed circuit 10 and the contact pads on the side of the electronic device substrate 11 may be directly pressed to be connected to each other, for example, in some embodiments, the contact pads of the wiring connecting terminals 110 on the side of the flexible printed circuit 10 and the contact pads on the side of the electronic device substrate 11 are electrically connected to each other through, for example, ACF, thereby electrically connecting the first functional line on the flexible printed circuit 10 to the touch driving lines connected to the first signal transmission portion 21 through the contact pads 211, and electrically connecting the second functional line on the flexible printed circuit 10 to the touch sensing lines connected to the second signal transmission portion 22 through the contact pads 221. Therefore, the first functional line and the second functional line of the flexible printed circuit 10 are electrically connected to the touch circuit structure of the electronic device substrate 11.

For example, the second functional circuit structure 23, that is, the display circuit structure, comprises a plurality of data lines (and gate lines, etc.), the plurality of data lines are electrically connected to pixel units, respectively, and the plurality of data lines extend to a side (the lower side in the figure) of the electronic device substrate 11, and are electrically connected to the contact pads 231 formed on this side. For the case of an organic light emitting diode (OLED) display substrate, the pixel unit comprises a display driving circuit. For example, the display driving circuit comprises a plurality of transistors, a capacitor, a light emitting device, and so on. For example, the display driving circuit is formed in various forms such as 2T1C, 3T1C, 7T1C, or the like. For example, in the situation that the flexible printed circuit 10 is connected to the electronic device substrate 11, the plurality of contact pads provided on the wiring connecting terminal 110 of the flexible printed circuit 10 further electrically connects the third functional line of the flexible printed circuit and the data lines of the second functional circuit structure 23 through the contact pads 231, thereby electrically connecting the third functional line of the flexible printed circuit 10 to the display circuit structure of the electronic device substrate 11. In this case, the second control circuit 1071 is a display driving IC, which can provide data signals for the display driving circuit, so that the light emitting state of the light emitting device can be controlled by the data signals provided by the display driving IC, so as to achieve different display effects.

For the case of a liquid crystal display (LCD) substrate, the pixel unit comprises a switching component, a first electrode (pixel electrode) and a second electrode (common electrode) for controlling deflection of liquid crystals, and the switching component is electrically connected to the first electrode. The second functional circuit structure 23, that is, the display circuit structure, comprises a plurality of data lines respectively connected to the pixel units. In this case, the second control circuit is a display driving IC, which can provide different data voltage signals to the pixel units through the data lines, thereby controlling the rotation state of the liquid crystals to achieve different display effects.

For example, the flexible printed circuit is connected to the electronic device substrate 11 by bonding process. During bonding process, the flexible printed circuit may be bonded to the electronic device substrate 11 and then bent to a rear side of the electronic device substrate 11, that is, the flexible printed circuit is mounted on the non-display side of the electronic device substrate 11, so as to facilitate the large-screen design of the display screen.

In the above flexible printed circuit of the electronic device substrate provided by some embodiments of the present disclosure, the transfer sub-circuit board connects the wiring portions, respectively electrically connected to the touch driving circuit, on the main sub-circuit board, so that the touch driving circuit and the display driving circuit on the main sub-circuit board do not intersect with each other, and the two wiring layers of the transfer circuit board are also shielded, so as to prevent signal crosstalk from being generated between wirings on two sides of the transfer sub-circuit board, on the same time, the structures of main sub-circuit board and the transfer sub-circuit board are simple, so the layout of the wirings is simple, which simplifies the manufacture process.

Figure 8:
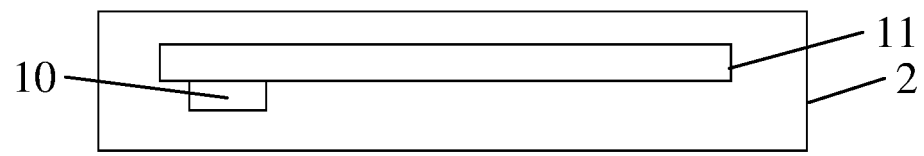
FIG. 8 is a diagram of an electronic device provided by some embodiments of the present disclosure.

At least one embodiment of the present disclosure provides an electronic device. FIG. 8 shows a schematic diagram of the electronic device. As shown in FIG. 8, the electronic device 2 comprises any one of the above electronic device modules 1, and the electronic device module 1 comprises the electronic device substrate 11 and the flexible printed circuit 10. For example, the upper side of the electronic device substrate 11 shown in FIG. 8 is the display side and the lower side is the non-display side; in this case, the flexible printed circuit 10 is bent to be placed on the non-display side of the electronic device substrate 11 after bonding process, so as to realize the large-screen design of the display screen.

The electronic device 2 may be, for example, any product or component with a display function such as a mobile phone, a tablet computer, a television, a display, a notebook computer, a digital photo frame, a navigator, etc. The embodiments of the present disclosure are not specifically limited in this aspect.

Figure 9:
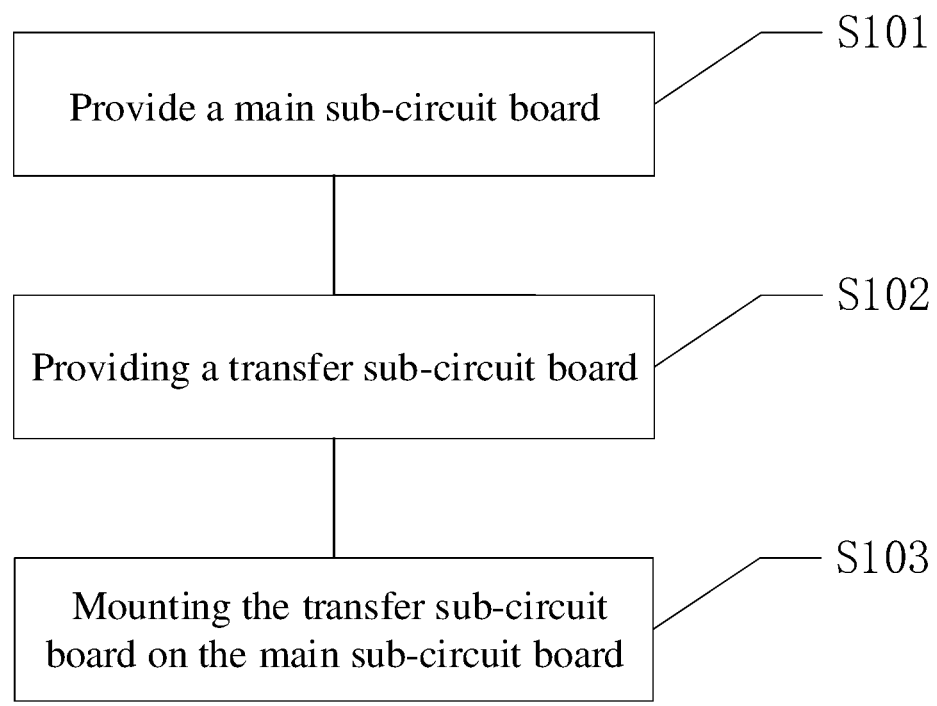
FIG. 9 is a flow diagram of manufacturing a flexible printed circuit provided by some embodiments of the present disclosure.

At least one embodiment of the present disclosure provides a manufacture method of a flexible printed circuit. As shown in FIG. 9, the manufacture method comprises steps S101-S103.

Step S101: Provide a Main Sub-Circuit Board.

Referring to FIG. 2, the main sub-circuit board 100 comprises a first transfer terminal 101, a first wiring portion 102, and a second wiring portion 103. The first transfer terminal 101 comprises a plurality of first contact pads; the first wiring portion 102 and the second wiring portion 103 are spaced apart from each other and are electrically connected to the first group of first contact pads 101A and the second group of first contact pads 101B of the first transfer terminal 101, respectively.

For example, referring to FIG. 5A, the main sub-circuit board 100 is formed by sequentially forming a first wiring layer 1002 and a first insulating layer 1003 on the first substrate 1001. For example, the first substrate 1001 is made from a material such as polyimide, polyester, or the like; the first wiring layer 1002 is made from a metal material or an alloy material such as copper, silver, aluminum, or the like; the first insulating layer 1003 is also made from a material such as polyimide, polyester, or the like. For example, firstly, a copper metal layer is formed on the first substrate 1001 by sputtering or the like, secondly, the copper metal layer is patterned to form the first wiring layer 1002, and then the first insulating layer 1003 is formed on the first wiring layer 1002 by coating or the like, and an opening is formed in the first insulating layer 1003 to form a structure such as the transfer terminals.

Step S102: providing a transfer sub-circuit board.

Referring to FIG. 3A, the transfer sub-circuit board 200 comprises a second transfer terminal 201 and a third wiring portion 202, the second transfer terminal 201 comprises a plurality of second contact pads, and two opposite terminals of the third wiring portion 202 are electrically connected to the first group of second contact pads 201A and the second group of second contact pads 201B of the second transfer terminal 201, respectively.

For example, referring to FIG. 6A, the transfer sub-circuit board 200 is formed by sequentially forming a second wiring layer 2002 and a second insulating layer 2003 on a first side of the second substrate 2001, and then sequentially forming a third wiring layer 2004 and a third insulating layer 2005 on a second side of the second substrate 2001. For example, the second substrate 2001 is made from a material such as polyimide, polyester, or the like; the second wiring layer 2002 and the third wiring layer 2004 are made from a metal material or an alloy material such as copper, silver, aluminum, etc. The third insulating layer 2005 is made from a material such as polyimide, polyester, or the like. For the formation method of each wiring layer and each insulation layer, reference may be made to the above embodiments, and details are not described herein again.

For example, in the example of FIG. 6A, the second transfer terminal 201 is formed on the first side of the transfer sub-circuit board 200, and in this case, an opening (or a via hole) may be formed in the second substrate 2001 and the third insulating layer 2005, so that the third wiring portion 202 can be exposed and led out through the via hole 2011 in the second substrate 2001 and the opening 2015 in the third insulating layer 2005, and then a plurality of patterned contact pads are formed, for example, by surface treatment, so as to form the transfer terminal.

For example, referring to FIG. 6A, in some embodiments, forming the transfer sub-circuit board 200 further comprises forming a shielding layer 2006 and a fourth insulating layer 2007 on the second side of the second substrate 2001. For example, the shield layer 2006 is suspended, or is configured to be electrically connected to a ground line. Therefore, the shielding layer 2006 can prevent signal crosstalk from being generated between the two wiring layers on the transfer sub-circuit board 200. For example, the shielding layer 2006 and the fourth insulating layer 2007 are formed with a hollow structure at a position corresponding to the via hole 2011 of the second substrate 2001, thereby leading out the third wiring portion 202.

Step S103: Mounting the Transfer Sub-Circuit Board on the Main Sub-Circuit Board.

Referring to FIG. 1, the first group of second contact pads 201A and the second group of second contact pads 201B of the second transfer terminal 201 are electrically connected to the first group of first contact pads 101A and the second group of first contact pads 101B of the first transfer terminal 101, respectively, thereby mounting the transfer sub-circuit board 200 on the main sub-circuit board 100, and sequentially and electrically connecting the first wiring portion 102, the third wiring portion 103 and the second wiring portion 202, so as to obtain the first functional line. During the mounting process, the second side of the transfer sub-circuit board 200 is closer to the main sub-circuit board 100 than the first side, so that the second functional line on the main sub-circuit board 100 is closer to the fourth wiring portion 203 electrically connected thereto on the transfer sub-circuit board 200. Relatively speaking, this arrangement is more advantageous for the wiring arrangements of the main sub-circuit board 100 and the transfer sub-circuit board 200.

For example, the second transfer terminal 201 of the transfer sub-circuit board 200 may be connected to the first transfer terminal 101 of the main sub-circuit board 100 by a method of hot pressing or soldering, or by a connector. For example, in the hot pressing method, an anisotropic conductive adhesive is formed between two transfer terminals, and then a hot pressing operation is performed on the transfer terminal, so as to connect the two transfer terminals by the anisotropic conductive adhesive. For example, the connector comprises a Zero Insertion Force (ZIF) connector or a Board To Board (BTB) connector, etc. The embodiments of the present disclosure do not specifically limit the connecting method.

For example, in one example, the BTB connector is used to connect the main sub-circuit board 100 and the transfer sub-circuit board 200. In this case, the connector comprises a male connector and a female connector that match with each other. For example, the first transfer terminal 101 of the main sub-circuit board 100 is provided with the female connector, and the second transfer terminal 201 of the transfer sub-circuit board 200 is provided with the male connector, so that the male connector and the female connector are interlocked to allow the transfer sub-circuit board 200 to be connected to the main sub-circuit board 100.

The manufacture method of a flexible printed circuit provided by the embodiments of the present disclosure provides a main sub-circuit board and a transfer sub-circuit board. The transfer sub-circuit board connects the wirings on both sides of the main sub-circuit board to avoid the wirings on the main sub-circuit board from intersecting with each other, and prevent or weaken the signal crosstalk, or eliminating the need for adding additional functional layers to prevent the signal crosstalk, thereby avoiding the complexity of the circuit board structure. In addition, the main sub-circuit board and the transfer sub-circuit board provided by the manufacture method have a simple single-layer or double-layer structure, so the layout of the wirings is simpler, and the manufacture difficulty of the main sub-circuit board and the transfer sub-circuit board can be reduced.

The following statements should be noted.

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. It should understood that, in the case in which a component such as a layer, film, region, substrate or the like is referred to be "on" or "under" another component, the component may be directly on or under the another component or a component is interposed therebetween.

(3) In case of no conflict, embodiments of the present disclosure and the features in the embodiments may be mutually combined to obtain new embodiments.

The embodiments described above are only specific implementations of the present disclosure, the protection scope of the present disclosure is not limited thereto. Any modifications or substitutions easily occur to those skilled in the art within the technical scope of the present disclosure should be within the protection scope of the present disclosure. Thus, the protection scope of the present disclosure should be based on the protection scope of the claims.

What is claimed is:

1. A flexible printed circuit, comprising:
a main sub-circuit board, the main sub-circuit board comprising a first transfer terminal, a first wiring portion and a second wiring portion, the first transfer terminal comprising a plurality of first contact pads, the first wiring portion and the second wiring portion being spaced apart from each other and being electrically connected to a first group of first contact pads and a second group of first contact pads of the first transfer terminal, respectively; and a transfer sub-circuit board, the transfer sub-circuit board comprising a second transfer terminal and a third wiring portion, the third wiring portion used for a first functional line, the second transfer terminal comprises a plurality of second contact pads, and the third wiring portion being configured for electrically connecting a first group of second contact pads with a second group of second contact pads of the second transfer terminal, wherein the transfer sub-circuit board is configured to be mounted on the main sub-circuit board by electrically connecting the first group of second contact pads of the second transfer terminal to the first group of first contact pads of the first transfer terminal and electrically connecting the second group of second contact pads of the second transfer terminal to the first group of first contact pads of the first transfer terminal, wherein the transfer sub-circuit board further comprises: a fourth wiring portion; a second substrate; a second wiring layer and a second insulating layer that are on a first side of the second substrate, wherein the second wiring layer comprises the third wiring portion; and a third wiring layer and a third insulating layer that are on a second side of the second substrate, wherein the third wiring layer comprises the fourth wiring portion and the second transfer terminal, the plurality of second contact pads of the second transfer terminal are exposed by the third insulating layer, and two opposite terminals of the third wiring portion are electrically connected to the first group of second contact pads and the second group of second contact pads of the second transfer terminal through openings, respectively, wherein the second side is opposite to the first side.

2. The flexible printed circuit according to claim 1, wherein the transfer sub-circuit board is mounted on the main sub-circuit board, so that the first wiring portion, the third wiring portion and the second wiring portion are sequentially and electrically connected with one another to obtain the first functional line.

3. The flexible printed circuit according to claim 1 or 2, further comprising a first control circuit connecting structure,
wherein the first control circuit connecting structure is provided on the main sub-circuit board and is electrically connected to the first wiring portion, or the first control circuit connecting combination structure is provided on the transfer sub-circuit board and is electrically connected to the third wiring portion, and
the first control circuit connecting structure is configured to provide a first electrical signal to the first functional line or receive a first electrical signal from the first functional line.

4. The flexible printed circuit according to claim 3, wherein the main sub-circuit board further comprises a second functional line,
the second functional line is electrically connected to the first control circuit connecting structure provided on the main sub-circuit board, and the first control circuit connecting structure is further configured to provide a second electrical signal to the second functional line or receive a second electrical signal from the second functional line.

5. The flexible printed circuit according to claim 4, wherein the main sub-circuit board further comprises a third functional line, and the third functional line is electrically connected to a third group of first contact pads of the first transfer terminal,
the transfer sub-circuit board further comprises a fourth wiring portion, and the fourth wiring portion is electrically connected to a third group of second contact pads of the second transfer terminal, and
the third functional line is electrically connected to the fourth wiring portion of the transfer sub-circuit board through the third group of first contact pads of the first transfer terminal and the third group of second contact pads of the second transfer terminal.

6. The flexible printed circuit according to claim 5, wherein the third functional line is between the first wiring portion and the second wiring portion, and the third group of first contact pads is between the first group of first contact pads and the second group of first contact pads.

7. The flexible printed circuit according to claim 1, wherein the main sub-circuit board comprises a first substrate, a first wiring layer and a first insulating layer, the first wiring layer and the first insulating layer are stacked on a side of the first substrate,
the first wiring layer comprises the first wiring portion, the second wiring portion, the second functional line and the first transfer terminal, and the plurality of first contact pads of the first transfer terminal are exposed by the first insulating layer.

8. The flexible printed circuit according to claim 1, wherein the second side is closer to the main sub-circuit board than the first side.

9. The flexible printed circuit according to claim 1, wherein the transfer sub-circuit board further comprises a shielding layer between the second wiring layer and the third wiring layer.

10. The flexible printed circuit according to claim 1, wherein the second transfer terminal of the transfer sub-circuit board is connected to the first transfer terminal of the main sub-circuit board through an anisotropic conductive adhesive, a solder material, or a connector.

11. An electronic device module, comprising an electronic device substrate and the flexible printed circuit according to claim 1;
wherein the electronic device substrate comprises a first functional circuit structure, and the first functional line of the flexible printed circuit is electrically connected to the first functional circuit structure.

12. The electronic device module according to claim 11, wherein the flexible printed circuit further comprises a second functional line,
the first functional circuit structure comprises a first signal transmission portion and a second signal transmission portion, the first functional line is electrically connected to the first signal transmission portion, and the second functional line is electrically connected to the second signal transmission portion.

13. The electronic device module according to claim 12, wherein the electronic device substrate further comprises a second functional circuit structure, the flexible printed circuit further comprises a third functional line, and the third functional line is electrically connected to the second functional circuit structure.

14. The electronic device module according to claim 13, wherein the first functional circuit structure is a touch circuit structure, and the second functional circuit structure is a display circuit structure.

15. The electronic device module according to claim 14, wherein the first signal transmission portion is a touch driving circuit of the touch circuit structure, and the second signal transmission portion is a touch sensing circuit of the touch circuit structure; or
the first signal transmission portion is the touch sensing circuit of the touch circuit structure, and the second signal transmission portion is the touch driving circuit of the touch circuit structure.

16. An electronic device, comprising the electronic device module according to claim 11.

17. A manufacture method of a flexible printed circuit, comprising:

provcircuit board, wherein the main sub-circuit board comprises a first transfer terminal, a first wiring portion and a second wiring portion, the first transfer terminal comprises a plurality of first contact pads, the first wiring portion and the second wiring portion are spaced apart from each other and are electrically connected to a first group of first contact pads and a second group of first contact pads of the first transfer terminal, respectively; providing a transfer sub-circuit board, wherein the transfer sub-circuit board comprises a second transfer terminal and a third wiring portion, the third wiring portion is used for a first functional line, the second transfer terminal comprises a plurality of second contact pads, and the third wiring portion electrically connects a first group of second contact pads with a second group of second contact pads of the second transfer terminal; and mounting the transfer sub-circuit board on the main sub-circuit board by electrically connecting the first group of second contact pads of the second transfer terminal to the first group of first contact pads of the first transfer terminal and electrically connecting the second group of second contact pads of the second transfer terminal to the second group of first contact pads of the first transfer terminal, wherein the transfer sub-circuit board comprises: a fourth wiring portion; and a third wiring layer and a third insulating layer that are on a second side of the second substrate, wherein the third wiring layer comprises the fourth wiring portion and the second transfer terminal, the plurality of second contact pads of the second transfer terminal are exposed by the third insulating layer, and two opposite terminals of the third wiring portion are electrically connected to the first group of second contact pads and the second group of second contact pads of the second transfer terminal through openings.

18. The manufacture method according to claim 17, wherein the second transfer terminal of the transfer sub-circuit board is connected to the first transfer terminal of the main sub-circuit board by a method of hot pressing or soldering, or by a connector.

* * * * *

UNITED STATES PATENT AND TRADEMARK OFFICE
CERTIFICATE OF CORRECTION

PATENT NO. : 11,412,613 B2
APPLICATION NO. : 16/766787
DATED : August 9, 2022
INVENTOR(S) : Ren Xiong et al.

Page 1 of 1

It is certified that error appears in the above-identified patent and that said Letters Patent is hereby corrected as shown below:

In the Claims

Column 21, Line 57-Column 22, Line 4 should read:
5. The flexible printed circuit according to claim 4, wherein the main sub-circuit board further comprises a third functional line, and the third functional line is electrically connected to a third group of first contact pads of the first transfer terminal,
    the fourth wiring portion is electrically connected to a third group of second contact pads of the second transfer terminal, and
    the third functional line is electrically connected to the fourth wiring portion of the transfer sub-circuit board through the third group of first contact pads of the first transfer terminal and the third group of second contact pads of the second transfer terminal.

Signed and Sealed this
Eleventh Day of July, 2023

Katherine Kelly Vidal
*Director of the United States Patent and Trademark Office*